United States Patent [19]
Jiang et al.

[11] Patent Number: 5,748,640
[45] Date of Patent: May 5, 1998

[54] TECHNIQUE FOR INCORPORATING A BUILT-IN SELF-TEST (BIST) OF A DRAM BLOCK WITH EXISTING FUNCTIONAL TEST VECTORS FOR A MICROPROCESSOR

[75] Inventors: Chongjun (June) Jiang, Dallas; David A. Spilo, Austin; Timothy J. Baldwin, Austin; Robert D. Bryfogle, Austin; Bobby I. Pinkerton, Jr., Austin, all of Tex.

[73] Assignee: Advanced Micro Devices, Sunnyvale, Calif.

[21] Appl. No.: 711,864

[22] Filed: Sep. 12, 1996

[51] Int. Cl.$^6$ .................................. G06F 11/00
[52] U.S. Cl. ........................................ 371/21.3
[58] Field of Search ................... 371/21.2, 21.3, 371/22.1, 22.5, 22.6, 27; 395/183.07, 183.01, 183.06

[56] References Cited

U.S. PATENT DOCUMENTS 5,416,783  5/1995  Broseghini et al. ............... 371/22.3
5,450,551  9/1995  Amini et al. ..................... 395/299

OTHER PUBLICATIONS

Dekker et al., "A Realistic Fault Model and Test Algorithms for Static Random–Access Memories," 1990 IEEE, pp. 1–5.

*Primary Examiner*—Vincent P. Canney
*Attorney, Agent, or Firm*—Conley, Rose & Tayon; B. Noel Kivlin

[57] ABSTRACT

A processing unit having a CPU core, an integrated RAM and a test unit, which may be implemented in either a test unit, which may be implemented in either hardware or software. A built-in self-test of the RAM is designed to run concurrently with the functional vectors used to test the CPU core. Once the core tests have been activated, a control register may be written to by which will activate the built-in self-test. Thus, the BIST and core testing may overlap to minimize test time.

21 Claims, 7 Drawing Sheets

FIG. 9

TECHNIQUE FOR INCORPORATING A BUILT-IN SELF-TEST (BIST) OF A DRAM BLOCK WITH EXISTING FUNCTIONAL TEST VECTORS FOR A MICROPROCESSOR

FIELD OF THE INVENTION

The present invention relates to testing of dynamic random access memories (DRAM), and particularly to a built-in self-test (BIST) for a DRAM array incorporated into a microprocessor such that the built-in self-test can operate in a background mode while functional tests are being run on the microprocessor core.

DESCRIPTION OF THE RELATED ART

DRAM arrays are susceptible to process related failures such as those resulting from dust particles on the chips or the masks, scratches and gate oxide pinholes, which may result in shorts or opens in the circuit. DRAM faults may be classified as stuck-at faults, stuck-open faults, transition faults, state coupled faults, multiple access faults and data retention faults. A memory cell is said to be stuck-at if a read from the cell is always at a certain logic value regardless of the action on the cell or influence from other cells. It can be caused by memory array faults or read/write logic faults. A memory cell is said to be stuck-open if it can never be accessed. It can be caused by address decoder faults or read/write logic faults. A memory cell with a transition fault will fail to undergo at least one of the transitions 0 to 1, or 1 to 0. Transition faults are caused by memory array faults. A memory cell is said to be state coupled to another cell if the first cell is fixed at a certain value only if the second cell is in one defined state. The testing of state coupled faults requires demonstrating that any arbitrary pair of cells in the memory is able to be in 0—0, 0–1, 1–0, and 1—1 states. State coupled faults may be caused by memory array faults or read/write logic faults. A memory cell is said to have a multiple access fault if a read/write action accesses multiple cells. Multiple access faults can be caused by memory array faults or address decoder faults. Finally, a memory cell with data retention fault is unable to retain the charge stored for a minimum required period.

A 9N test algorithm (where N is the number of addresses) may be used to test all of the faults outlined above. The 9N built-in self-test appears in Table 1 below. In what follows, IMx denotes sweeping from address 0 to n–1; DMx denotes sweeping from address n–1 to 0; W0 denotes writing a data background; R0 denotes reading and comparing with data background; W1 denotes writing an inverted data background; and R1 denotes reading and comparing with an inverted data background.

TABLE 1

| 9N Test |
|---|
| IM1: W0 |
| IM2: R0,W1 |
| IM3: R1,W0 |
| DM1: R0,W1 |
| DM2: R1,W0 |

In some RAMs the read/write logic includes a data latch. In such RAMs, detection of stuck open faults is not guaranteed by the 9N test algorithm set forth above because the last read data of the memory is stored in the data latch. If a stuck-open cell is read, the contents of the data latch will be passed to the output pin. If this is the expected data to be read from the memory, the stock open fault will not be detected. Consequently, for RAMs employing a data latch, a 13N test algorithm is used (the data latch is used to broaden the read window of the RAM during normal operation). The 13N test algorithm is set forth in Table 2 below:

TABLE 2

| 13N Test |
|---|
| IM1: W0 |
| IM2: R0,W1,R1 |
| IM3: R1,W0,R0 |
| DM1: R0,W1,R1 |
| DM2: R1,W0,R0 |

Further details regarding the 9N and 13N test algorithms may be found in Rob Dekker, Frans Beenker, Loek Thussen, "A Realistic Fault Model & Test Algorithms for Static Random Access Memories," IEEE Log Number 9034766 (Jul. 10, 1989), which is hereby incorporated by reference.

As can be readily appreciated, performing a built in self test on even a relatively small RAM can take a relatively large amount of time. When the RAM is on a chip that also includes a processor core, the built-in self-test must generally be run after the processor core functional tests, because completion of any functional core tests will reset the entire chip. However, the built-in self-test is to be run upon every reset. Thus, the built-in self-test must be run after the core functional testing.

While adequate testing may be done in such a fashion, it takes a relatively long period of time. Increasingly, there is a desire for faster completion of various self tests. It would be advantageous to be able to perform the built-in self-test of an on-chip RAM at the same time as the processor core functional tests were being run. Moreover, it would be desirable to divide a built-in self test into several smaller patterns, individually selectable via an internal register accessible by the core functional test vectors and to allow the overlapping of the DRAM built-in self-test and existing core functional vectors to minimize test time without forcing a complete chip wide built-in self-test implementation.

SUMMARY OF THE INVENTION

In accordance with one embodiment of the present invention, there is provided a processing unit having a CPU core and an integrated RAM and a test unit, which may be implemented in any of several ways, including as one or more state machines, or as microcode. A built-in self-test of a DRAM array is designed to run concurrently with the functional vectors used to test the microprocessor core. More particularly, once the core tests have been activated, a control register may be written to by the core tests, which will initiate the BIST. The BIST is divided into small patterns which are individually selectable via an internal register accessible by the functional test vectors. This allows the overlapping of the DRAM BIST and existing core functional vector testing to minimize test time without forcing a complete chip wide BIST implementation.

A first built-in self-test tests for all of the stuck-open, stuck-at, and transition faults. In addition, by running a plurality of patterns, the first test tests for state coupling faults in each word and half of the multiple access faults and state-coupling faults between words. A second built-in self-test tests for the remaining multiple access faults and the state-coupling faults between words. A data retention test tests whether the RAM can retain either a 1 or a 0 for a duration of time at least as long as a refresh period. Finally, a burn-in test is run to exercise each bit at a maximum rate.

The first BIST test includes writing each of setting every word in the RAM array to one of five background patterns; starting with the least significant word, reading each word, comparing it to zero, and writing an inverted word back; reading each inverted word again, and checking the inverted word against the value written back. Finally, upon reaching the most significant word, the process is repeated with the inverted pattern. The first BIST test is run with each of five background patterns. If, at any step in this process, the RAM array fails the test, the test will be halted and the memory location that failed will be stored in a test address register.

The second BIST test is similar to the first, but is run with only one background pattern. It begins with initializing the RAM array with a data background and, starting with a most significant word, reading each word and writing an inverse of that word back into it's memory location. Once the least significant word has been reached, the process is repeated, starting again at said most significant word, but reading the now-stored inverse. The inverted word is then inverted and stored back into the original memory location.

The data retention test tests for whether the memory locations can retain a value for the refresh period. More particularly, it includes writing a first data background to each memory location and waiting a predetermined period during which a dummy write to a pseudo address is executed, in order to achieve a maximum leakage condition. Next, each memory location is read and compared to the first data background. If the test is successful, a second data background is written to each memory location. Again, a predetermined wait state occurs during which a dummy write to a pseudo address is executed and, finally, each memory location is read and compared to the second data background. Again, the address of a failed memory location is written to the test address register.

The burn in test simulates the maximum access rate of the RAM array. The burn-in test comprises writing a first data background to each memory location and then writing a second data background to each memory location.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives following within the spirit and scope of the present invention, as defined by the appended claims.

DETAILED DESCRIPTION OF THE PREFERRED EMBODIMENT

Figure 1:
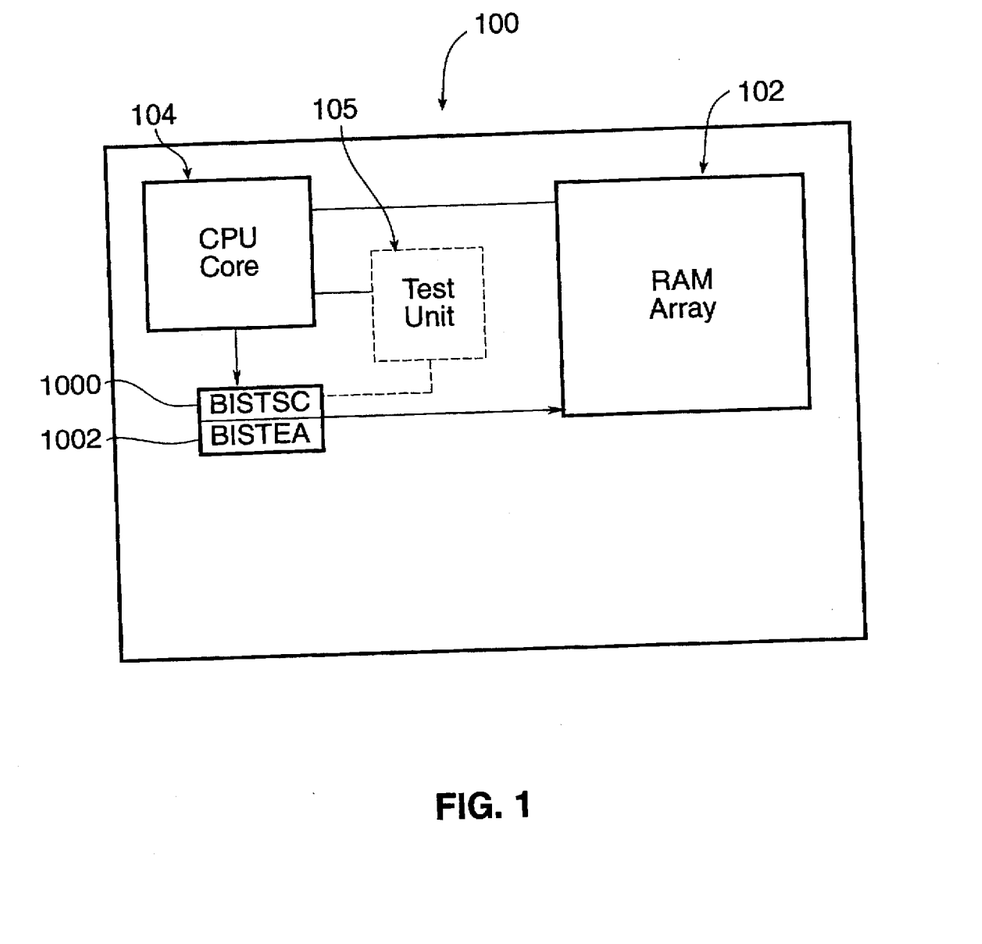
FIG. 1 is a block diagram of a processor according to one embodiment of the present invention.

Turning now to FIG. 1, there is shown a block diagram of an exemplary processor 100 having a built in RAM array 102 and processor core 104. In a preferred embodiment, the processor core is a 186 processor core. It is to be understood, however, that the processor core may implement a variety of instruction sets including those compatible with other members of the X86 family as well as the PowerPC and Pentium processor instruction sets.

Processor 100 includes a test unit 105, which may be implemented, for example, as one or more state machines or microcode. Test unit 105 is configured to activate the CPU core 104 functional tests as well as the RAM array tests. It is to be noted that the core tests need not access external memory and as such, the RAM array may be tested concurrently. More particularly, the CPU core testing can include testing of functional units, dispatch logic, and the like. Once the CPU core tests have been initiated, the core tests initiate the RAM array tests, preferably by instructions to specialized control registers, as will be discussed in more detail below.

The integrated processor 100 further includes a built-in self-test status/control register BISTSC 1000 and a built-in self-test error address register BISTEA 1002. The status/control register BISTSC is used to invoke the built-in self-test and store the results while the error address register BISTEA is used to store information about any failures.

Figure 2:
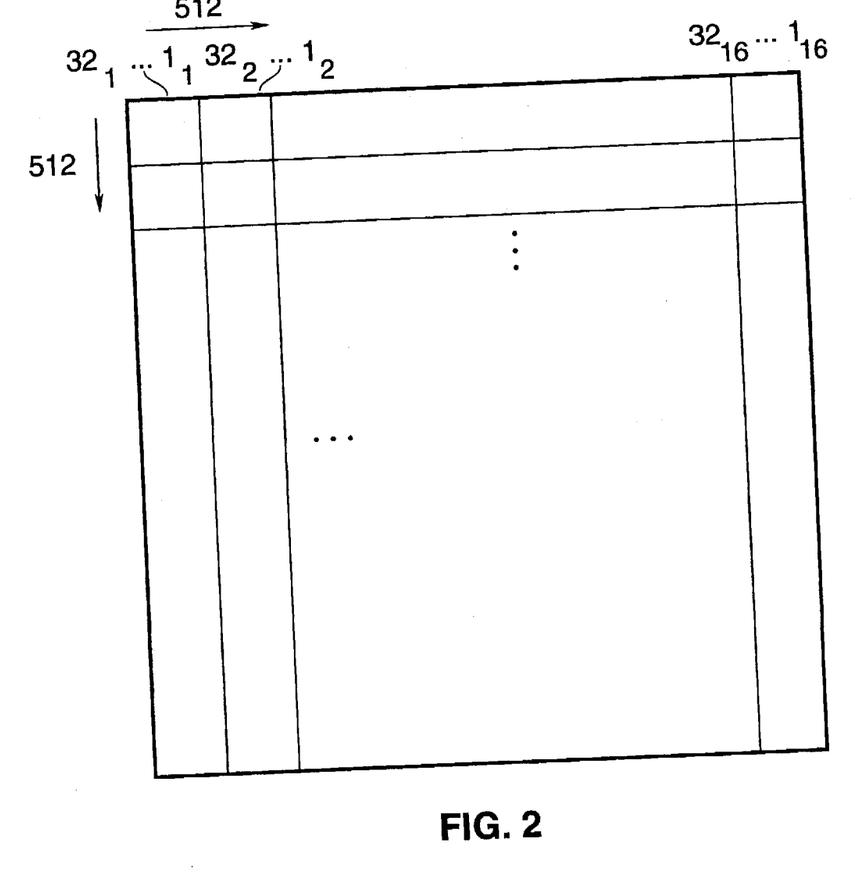
FIG. 2 is a diagram of an exemplary memory array.

Turning now to FIG. 2, there is shown a diagram of an exemplary 32 KByte DRAM. The 32 KByte DRAM is organized into 512 rows of 512 columns. Each row contains thirty-two 16-bit words. Each combination of row number and column number addresses a unique cell. Each row is organized such that the first bits from each of the thirty-two words are all located in the first thirty-two columns. The second bit of each thirty-two words are located in the next thirty-two columns and so on. This arrangement requires two accesses to write to neighboring bits in the row.

The present invention implements a built-in self test as eight partitioned tests, including a data retention test and a special burn-in test. Together, these tests will test for all of the faults mentioned above: the stuck-at, stuck-open, transition, state coupled, multiple access and data retention faults. However, the tests do not cover faults in decoding logic for high byte and low byte within a word.

BIST Test 1 is set forth in Table 3 below:

TABLE 3

| BIST Test 1 |
| --- |
| IM0: W0 (initialization) |
| IM1: R0,W1,R1 |
| IM2: R1,W0,R0 |

Data backgrounds: 0x0000, 0x5555, 0x3333, 0x0f0f, 0x00ff

BIST Test 1 is initialized by setting every word in the RAM array to one of the five background patterns. Then, starting with the least significant word, each word is read, compared to 0 and the inverse is written back into that word in a single access. The word is then read again, and checked against the new value before continuing to the next word. When the most significant word has been tested, the test repeats. This time, however, it checks for an inverted pattern and writes the normal pattern back.

BIST 1 will test for all of the stuck-at, stuck-open, and transition faults. It covers all of the state coupling faults by running the five different data backgrounds through the test. In addition, it tests for half of the state coupling faults between words and half of the multiple access faults.

The initialization writes are 256 bit writes which take two cycles per access with pipelining. All other accesses are sixteen bit accesses. The read, check, and write steps occur in one access but the entire access (four cycles) must be completed before the new value can be read. The read and verify takes two cycles. Thus it requires 198,656 cycles to complete BIST Test 1 with one data background.

BIST Test 2 is set forth in Table 4 below:

TABLE 4

| BIST Test 2 |
| --- |
| DM0: W0 (initialization) |
| DM1: R0,W1 |
| DM2: R1,W0 |

Data background: 0x0000

BIST Test 2 is similar to BIST Test 1 except that it begins with the most significant word and sweeps to the least significant word. In this test, it is not necessary to check that the new value was correctly written since it has already been checked in BIST Test 1.

BIST Test 2 is designed to test for the remaining fifty-percent of the state coupling faults between words and the multiple access faults that are not tested for by built-in self-test 1 BIST Test 2 needs only to be run with the default data background.

The initialization writes are 256 bit writes which take two cycles per access with pipelining, while other accesses are sixteen bit accesses. Read followed by a write is merged into a read-invert-write access which takes four cycles. Thus, 133,120 cycles are required to complete the test.

The Data Retention test is set forth in Table 5 below:

TABLE 5

| Data Retention Test |
| --- |
| IM0: W0 (initialization) |
| WAIT (W1 to a pseudo address) |
| IM1: R0 |
| IM2: W1 |
| WAIT (W0 to a pseudo address) |
| IM2: R1 |

The data retention test is designed to verify that the DRAM can retain either a 1 or a 0 for a duration of time equal to the refresh time period.

Two data retention cycles plus 2,457,600 cycles are required to complete the regular built-in self-test. The time-out period is based on 512 times the value in the DRAM control register. During wait states, an inversion of the previous data is written to a pseudo address to pull up or pull down all the data lines in a row in the DRAM array to achieve the maximum leakage condition.

The Burn-In test is set forth in Table 6 below:

TABLE 6

| Burn-In Test |
| --- |
| IM0: W0 |
| IM1: W1 |

The purpose of the BIST Burn-In test is to simulate a maximum access rate in the DRAM. Each cell is toggled in order to insure that the maximum switching and coverage are achieved. The BIST Burn-In test accesses 256 bits each write and can be pipelined, since writes to DRAM are implemented as read/modify writes. Write 0 and write 1 cover all read functions as well. The BIST Burn-In requires test 4,096 cycles to complete.

Figure 3:
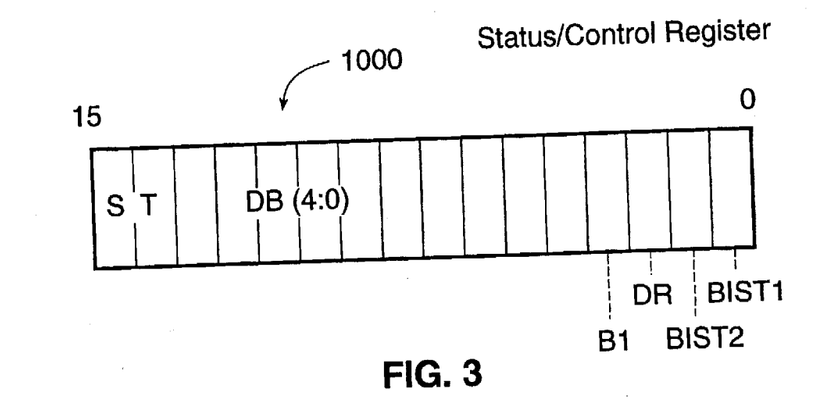
FIG. 3 is a diagram of a status/control register according to one embodiment of the present invention.
Figure 4:
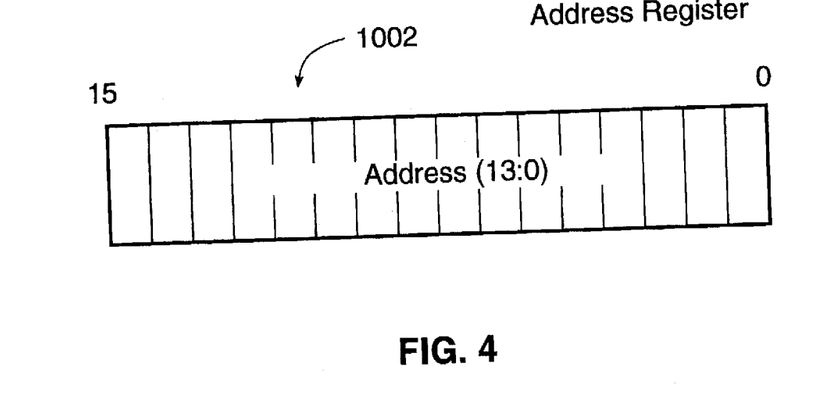
FIG. 4 is a diagram of an error address register according to one embodiment of the present invention.
Figure 5:
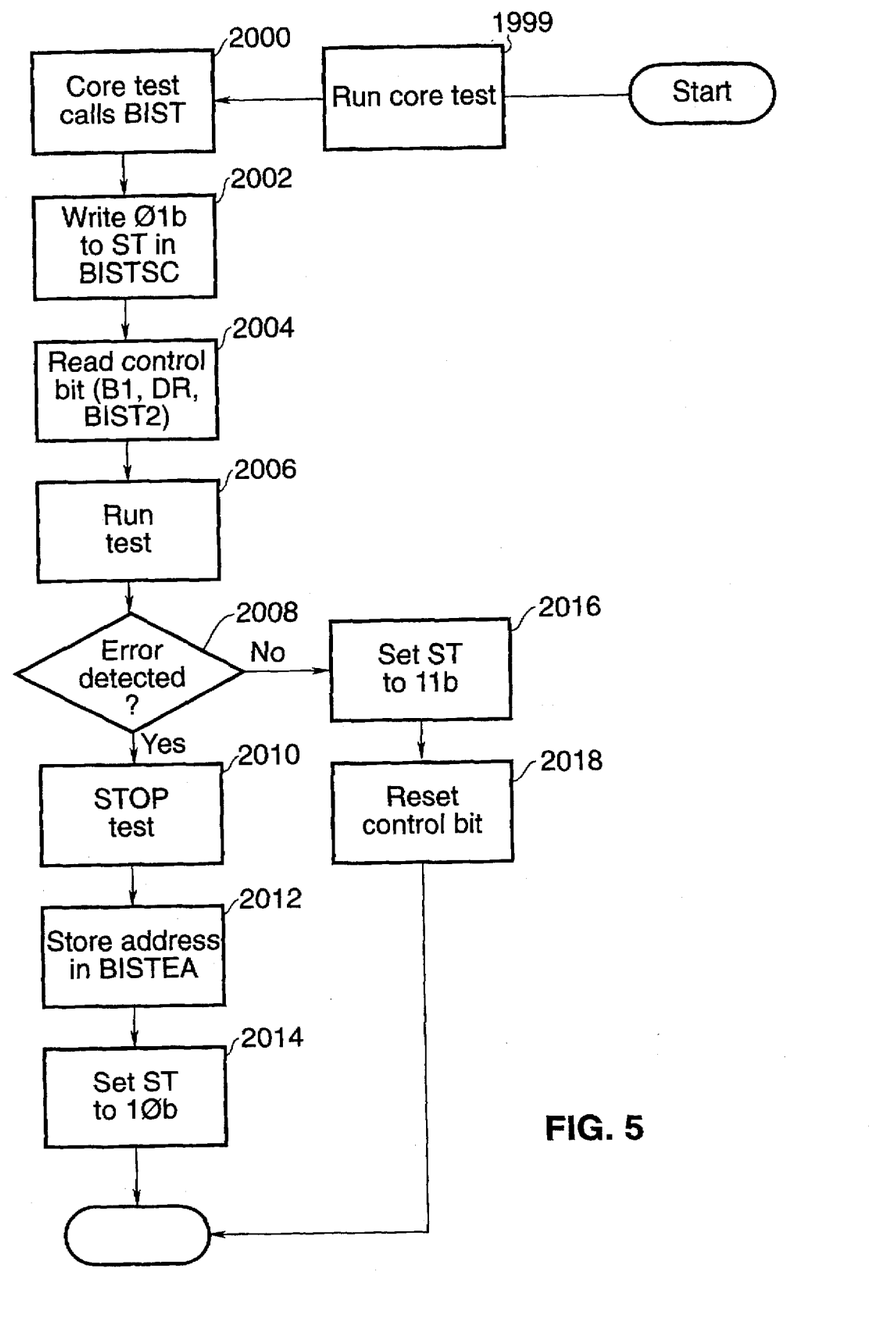
FIG. 5 is a flow chart illustrating a method according to an embodiment of the present invention.
Figure 6:
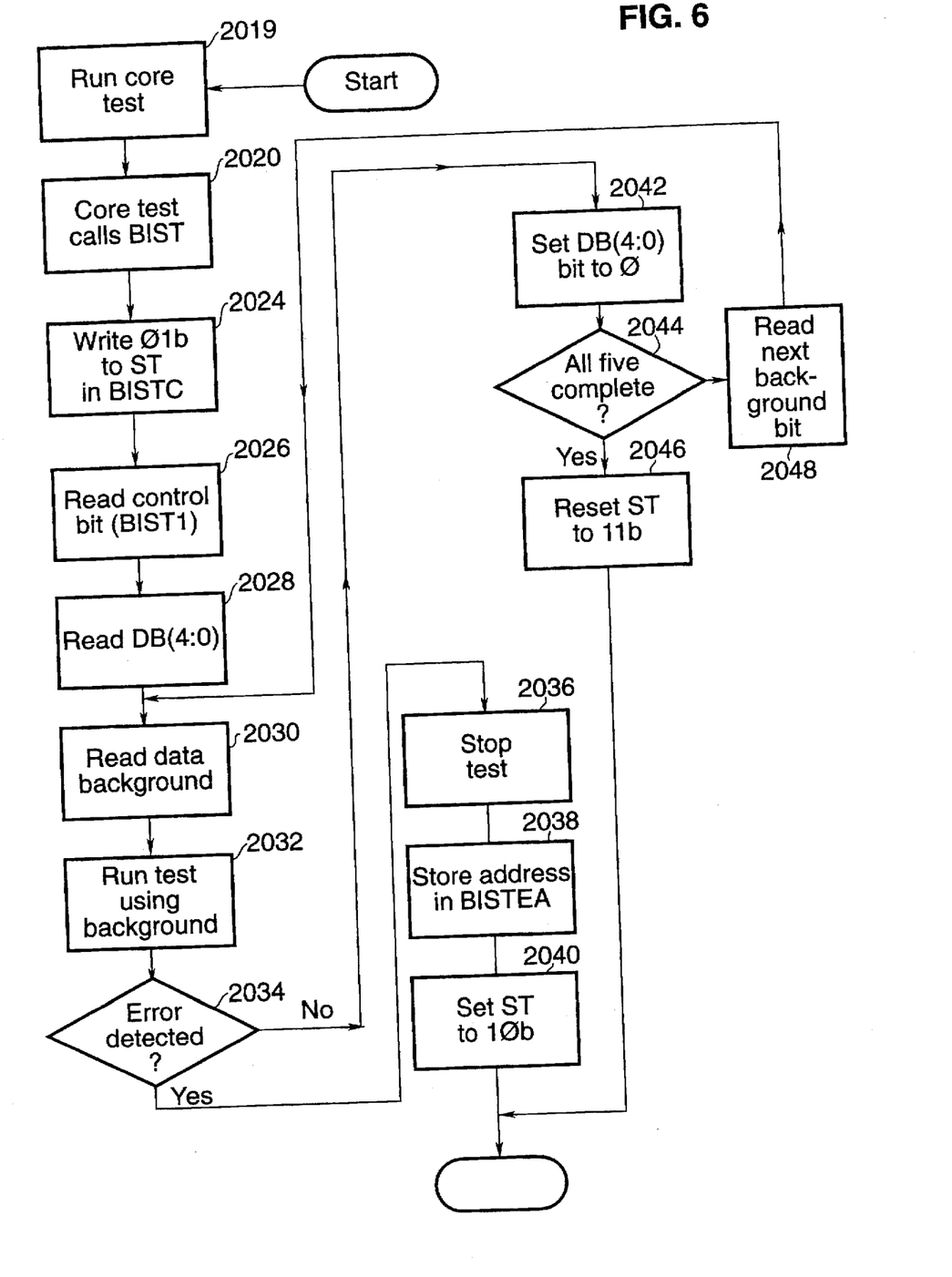
FIG. 6 is a flow chart illustrating a method according to another embodiment of the present invention.

Turning now to FIG. 3, there is shown a diagram of a status/control register BISTSC 1000 used to control the BIST mechanism. Sixteen bit BISTSC 1000 includes two status bits ST(1:0), five data background bits DB(4:0), a burn-in bit BI, a data retention control bit DR, a BIST Test 1 bit BIST1, and a BIST Test 2 bit BIST2. BIST control register BISTSC is used in conjunction with a BIST self-test error address register BISTEA 1002, illustrated in FIG. 4. Setting a bit in 815 TSC will cause the particular test to be run. Resetting the bit causes the test to be disabled. Operation of the status/control register BISTSC and address register BISTEA mechanism in invoking the appropriate built-in self-test may be understood with regard to FIGS. 5 and 6. FIG. 5 relates to the BIST Burn-In, Data Retention and BIST Test 2 tests. FIG. 6 relates to BIST Test 1. It is to be noted, however, that the tests are preferably run in sequence, whether order of testing preferably BIST Test 1, BIST Test 2, Data Retention, and Burn-In. Thus, FIG. 5 and 6 are illustrative only.

Turning now to FIG. 5, the core tests are begun (Step 1999) and the built-in self-test begins by the core test calling it (Step 2000). The BIST may be started by setting the BIST status bits to 0:1 (Step 2002). The particular tests (burn-in, data retention BIST Test 1, and BIST Test 2) are begun by setting the appropriate bit in the status/control register BISTSC (Step 2004). It is noted that the process with BIST Test 1 is generally similar and will be described in greater detail with regard to FIG. 6. Once the appropriate control bit has been set, the test will be run according to the methods set forth above (Step 2006). If an error is detected (Step 2008), the test will stop (Step 2010), with the control bits that have completed successfully being reset. The bits for the tests remaining to be run remain set. The built-in self-test error address register BISTEA then stores the address where the BIST stops (2012). The address latched is always the next address being accessed after the actual error address. Thus, for a test that uses an incremental address sweep, the address latched is one plus the error address. For a test that uses a decremental address sweep, the address latched is one minus the error address. If the error address is the last in the address sweep, then the address latched is the first in the next address sweep. If, however, the error is detected during the last access within a test, with a certain test pattern, then the address latched is the actual error address. Finally, in the event of an error, the ST bits will be set to 1:0 (Step 2014). If after running the test no error had been detected then the status bits would be set to 1:1 (Step 2016) and the appropriate control bit would be reset to 0 (Step 2018).

Turning now to FIG. 6, there is shown a flow chart illustrating the operation of the built-in self-test error address register and the built-in self-test status/control register when invoking built-in self-test 1. First, the core test begins (Step 2019). Upon being called by a core test, (Step 2020) ST 1:0 is 0:0. The first step is to write (0:1) to the status bits in the BIST control register (Step 2024). Next, the control bit BIST 1 is read (Step 2026). Once the appropriate control bit has been read, in this case designating built-in self-test 1, the test will proceed. In the case of built-in self-test 1 the data background bits are also read (Step 2024). The data background bits DB(4:0) select the data backgrounds to be run with the built-in self-test Test 1. Data background 0 is 0000H; data background 1 is 0X5555; data background 2 is 3333H; data background 3 is 0F0FH; data background 4 is 00FFH (Step 2030). Once the data background is read (Step 2030) the test is run using the individual background (Step 2032). If an error is detected (Step 2034) the test will be stopped (Step 2036) and the address at which the self test has stopped will be stored in the BIST error address register BISTEA (Step 2038). Next, the status bits will be set to 1,0 (Step 2040) to indicate an error condition. If no error had been detected in Step 2034 the data background bit of the data background which had been tested would be set to 0 (Step 2042). If all five data backgrounds have been run then the status bits would be set to 1,1 and the test would be completed. However, if the data backgrounds have not all been run (Step 2044) then the next background bit will be read (Step 2048) and the test will be run using that designated data background. The order of execution is preferably from data background 0 to data background 4.

Figure 7:
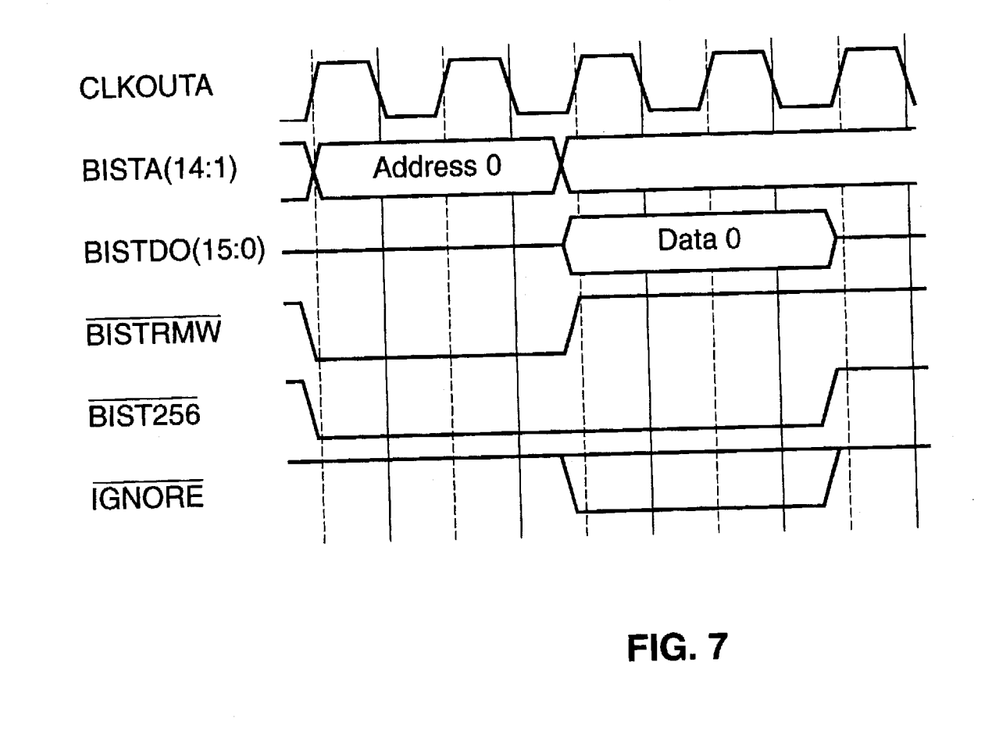
FIG. 7 is a timing diagram of a BIST write access.
Figure 8:
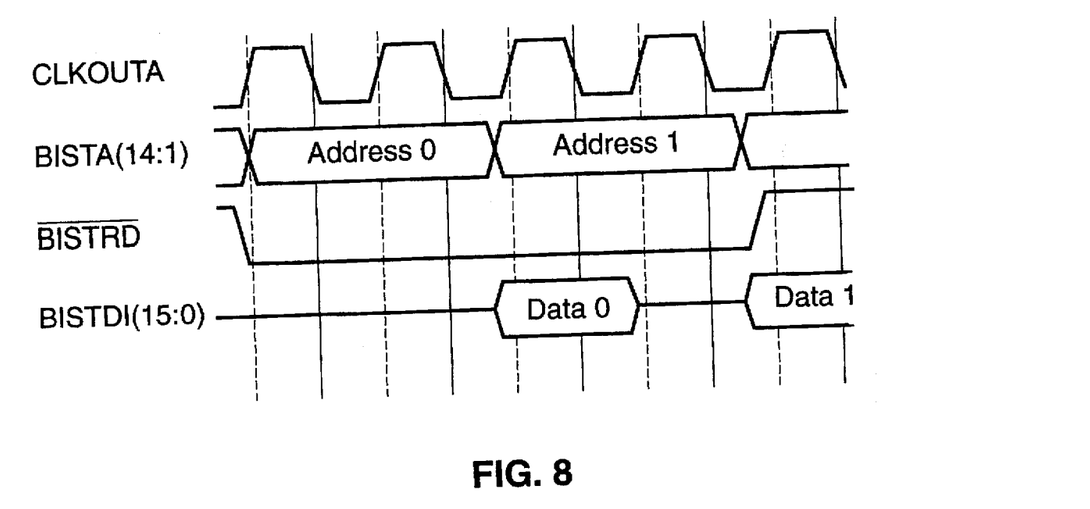
FIG. 8 is a timing diagram of a BIST read access.
Figure 9:
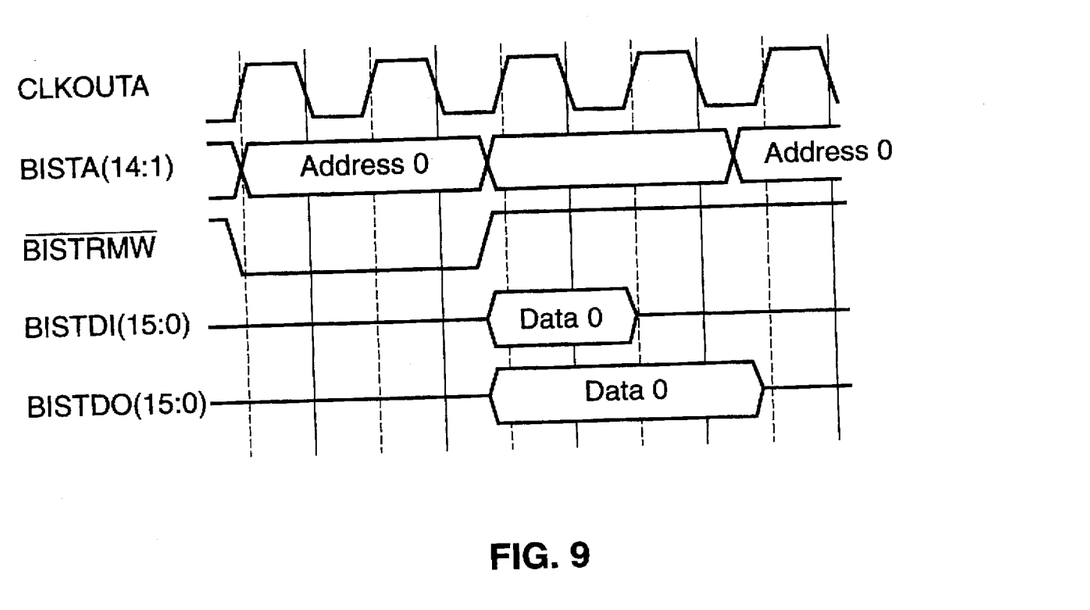
FIG. 9 is a timing diagram of a BIST read-invert-write access.

Turning now to Table 7 and FIGS. 7–9 there is shown the BIST address data interface and BIST timing diagrams. The interface signals are illustrated in Table 6:

TABLE 7

| | |
|---|---|
| • BISTA (14:1) | -Output. BIST address |
| • BISTRD | -Output. BIST read. |
| • BISTRMW | -Output. BIST read-modify-write. |
| • BIST256 | -Output. BIST access to 256 bits. |
| • BISTMODE | -Output. BIST mode, asserted during entire BIST |
| • IGNORE | -Output. Ignore. This signal is only used during pseudo-writes to DRAM. |
| • BISTDO (15:0) | -Output. Data to write with. |
| • BISTDI (15:0) | -Input. BIST data read. |

More particularly, FIG. 7 illustrates the BIST write access. BIST writes are 256 byte accesses used only for memory initialization and the burn-in built-in self-test. Each write access requires four clock cycles to complete, but can be pipelined to two cycles per access. The built-in self-test read access is illustrated in FIG. 8. Built-in self-test reads are sixteen bit accesses which take two cycles to complete. BIST read invert write cycles are illustrated in FIG. 9. A read followed by a write to the same address is merged into one read invert write access, which takes four cycles. Read invert write accesses are sixteen bit accesses.

The invention described in the above-detailed description is not intended to be limited to the specific form set forth herein, but on the contrary, it is intended to cover such alternatives, modifications, and equivalents as can reasonably be included within the spirit and scope of the invention as defined by the appended claims.

We claim:

1. A processing unit comprising:

a central processing unit (CPU) core;

a random access memory (RAM) array coupled to said CPU core;

a test unit operatively coupled to said CPU core and configured to run a CPU core functional test and concurrently run a RAM array test;

wherein said test unit is further coupled to a built-in-self-test status/control register, said built-in-self-test status/control register configured to initiate, responsive to said test unit, at least one test of said RAM array.

2. The processing unit of claim 1, further including a built-in self-test error address register configured to store a value indicative of an address of a memory location in said RAM array which has failed said at least one test of said RAM array.

3. The processing unit of claim 2, wherein said at least one test of said RAM array tests for stuck-at, stuck-open, transition and state coupling faults of said RAM array.

4. The processing unit of claim 3, wherein said at least one test of said RAM array comprises:

setting every word in said RAM array to one of five background patterns;

starting with the least significant word, reading each word, comparing it to zero, and writing an inverted word back;

reading said inverted word again, and checking said inverted word against the value written back; and upon testing a most significant word, repeating said starting and reading steps with an inverted pattern.

5. The processing unit of claim 2, wherein said at least one test of said RAM array tests for state coupling faults between words and multiple access faults.

6. The processing unit of claim 5, wherein said at least one test of said RAM array comprises:

initializing said RAM array with a data background;

starting with a most significant word, reading each word and writing an inverse of said word back into said word's memory location; and upon reaching a least significant word, starting again at said most significant word, reading said inverse, and writing back an inverse of said inverse into said inverse's memory location.

7. The processing unit of claim 2, wherein said at least one test of said memory array is a data retention test.

8. The processing unit of claim 7, wherein said data retention test comprises writing a first data background to each memory location;

waiting a predetermined period during which a dummy write to a pseudo address is executed;

reading each memory location and comparing a content of said memory location to said first data background;

writing a second data background to each memory location;

waiting a predetermined period during which a dummy write to a pseudo address is executed; and reading each memory location and comparing a content of said memory location to said second data background.

9. The processing unit of claim 8, wherein said predetermined period is equal to a refresh time period for said RAM array.

10. The processing unit of claim 2, wherein said at least one test is a burn-in test that simulates maximum access rate of said RAM array.

11. The processing unit of claim 10, wherein said burn-in test comprises writing a first data background to each memory location; and writing a second data background to each memory location.

12. A method for testing a processing unit including a processor core and a memory array, comprising:

running a processor core functional test;

running a RAM array test concurrently with said processor core functional test;

wherein said running a RAM array test includes setting a bit in a control register to select one of a plurality of tests to be run on said RAM array;

storing an address in an address register indicative of a memory location that has failed said one of said plurality of tests; and halting said one of said plurality of tests responsive to detecting that said memory location has failed said one of said plurality of tests.

13. The method for testing a processing unit of claim 12, wherein running said one of said plurality of tests includes running tests for stuck-at, stuck-open, transition and state coupling faults of said RAM array.

14. The method for testing a processing unit of claim 13, wherein running one of said plurality comprises:

setting every word in said RAM array to one of five background patterns;

starting with the least significant word, reading each word, comparing it to zero, and writing an inverted word back;

reading said inverted word again, and checking said inverted word against the value written back; and upon testing a most significant word, repeating said starting and reading steps with an inverted pattern.

15. The method for testing a processing unit of claim 12, wherein running said one of said plurality of tests includes running tests for state coupling faults between words and multiple access faults.

16. The method for testing a processing unit of claim 15, wherein running said one of said plurality of tests comprises:

initializing said RAM array with a data background;

starting with a most significant word, reading each word and writing an inverse of said word back into said word's memory location; and upon reaching a least significant word, starting again at said most significant word, reading said inverse, and writing back an inverse of said inverse into said inverse's memory location.

17. The method for testing a processing unit of claim 12, wherein running said one of said plurality of tests includes running a data retention test.

18. The method for testing a processing unit of claim 17, wherein said running a data retention test comprises writing a first data background to each memory location;

waiting a predetermined period during which a dummy write to a pseudo address is executed;

reading each memory location and comparing a content of said memory location to said first data background;

writing a second data background to each memory location;

waiting a predetermined period during which a dummy write to a pseudo address is executed; and reading each memory location and comparing a content of said memory location to said second data background.

19. The method for testing a processing unit of claim 18, wherein said predetermined period is equal to a refresh time period for said RAM array.

20. The method for testing a processing unit of claim 12, wherein running said one of said plurality of tests includes running a burn-in test that simulates maximum access rate of said RAM array.

21. The method for testing a processing unit of claim 20, wherein running said burn-in test comprises writing a first data background to each memory location; and writing a second data background to each memory location.

* * * * *